(12) United States Patent
Oosawa et al.

(10) Patent No.: US 8,212,385 B2
(45) Date of Patent: Jul. 3, 2012

(54) CAR POWER SOURCE APPARATUS FOR DETECTING A GROUND FAULT IN A VEHICLE POWER SUPPLY

(75) Inventors: Takeshi Oosawa, Takasago (JP); Masaki Yugou, Kakogawa (JP)

(73) Assignee: Sanyo Electric Co., Ltd., Osaka (JP)

( * ) Notice: Subject to any disclaimer, the term of this patent is extended or adjusted under 35 U.S.C. 154(b) by 97 days.

(21) Appl. No.: 12/549,901

(22) Filed: Aug. 28, 2009

(65) Prior Publication Data

US 2010/0052419 A1 Mar. 4, 2010

(30) Foreign Application Priority Data

Aug. 29, 2008 (JP) ................................. 2008-222489

(51) Int. Cl.
 *H02H 7/18* (2006.01)
(52) U.S. Cl. .................. 307/10.7; 307/9.1; 307/10.1
(58) Field of Classification Search ................ 307/9.1, 307/10.1, 10.7
See application file for complete search history.

(56) References Cited

U.S. PATENT DOCUMENTS

| | | | | |
|---|---|---|---|---|
| 5,561,380 A | * | 10/1996 | Sway-Tin et al. | 324/509 |
| 5,760,587 A | * | 6/1998 | Harvey | 324/434 |
| 6,795,783 B2 | * | 9/2004 | Kotlow et al. | 702/65 |
| 7,292,042 B2 | * | 11/2007 | Morita et al. | 324/509 |
| 2010/0207635 A1 | * | 8/2010 | Plagens et al. | 324/509 |

FOREIGN PATENT DOCUMENTS

JP 2008-139249 6/2008

* cited by examiner

*Primary Examiner* — Adi Amrany
(74) *Attorney, Agent, or Firm* — Wenderoth, Lind & Ponack, L.L.P.

(57) ABSTRACT

A car power source apparatus is provided to include a driving battery 11 outputting an output voltage for driving a car, a monitoring and control circuit 21 monitoring and controlling the driving battery 11 and connected to an auxiliary battery 3 via power supply lines 2, and a battery case 1 housing the driving battery 11 and the monitoring and control circuit 21 and connected to a car chassis ground 5 via a ground line 4. Further, the power source apparatus is provided with a connection detection circuit 40. This connection detection circuit 40 determines the condition of the connection of the battery case 1 and an auxiliary battery 3 power supply line 2 via the ground line 4 and the car chassis ground 5 to determine the condition of the ground line 4 connection.

14 Claims, 5 Drawing Sheets

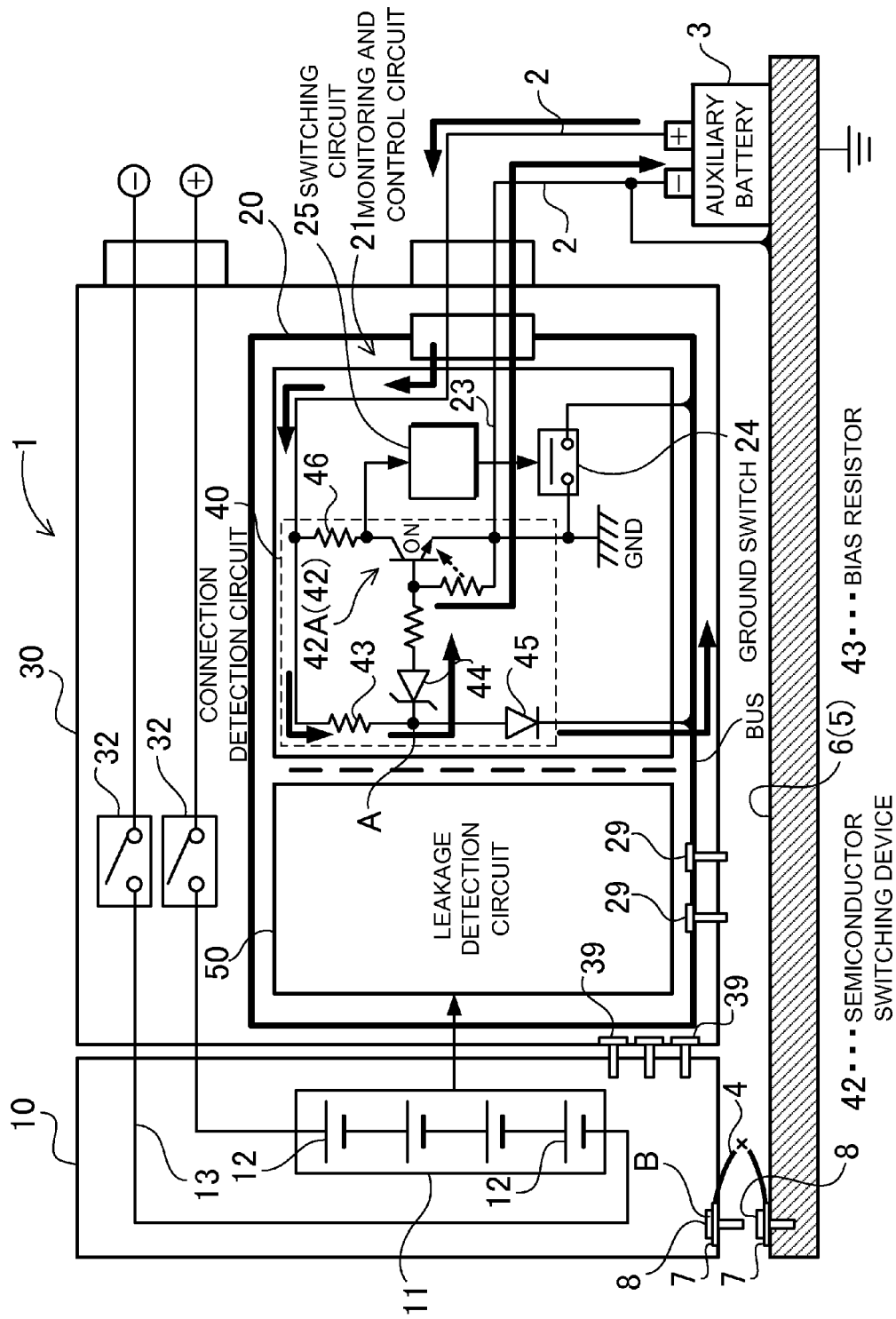

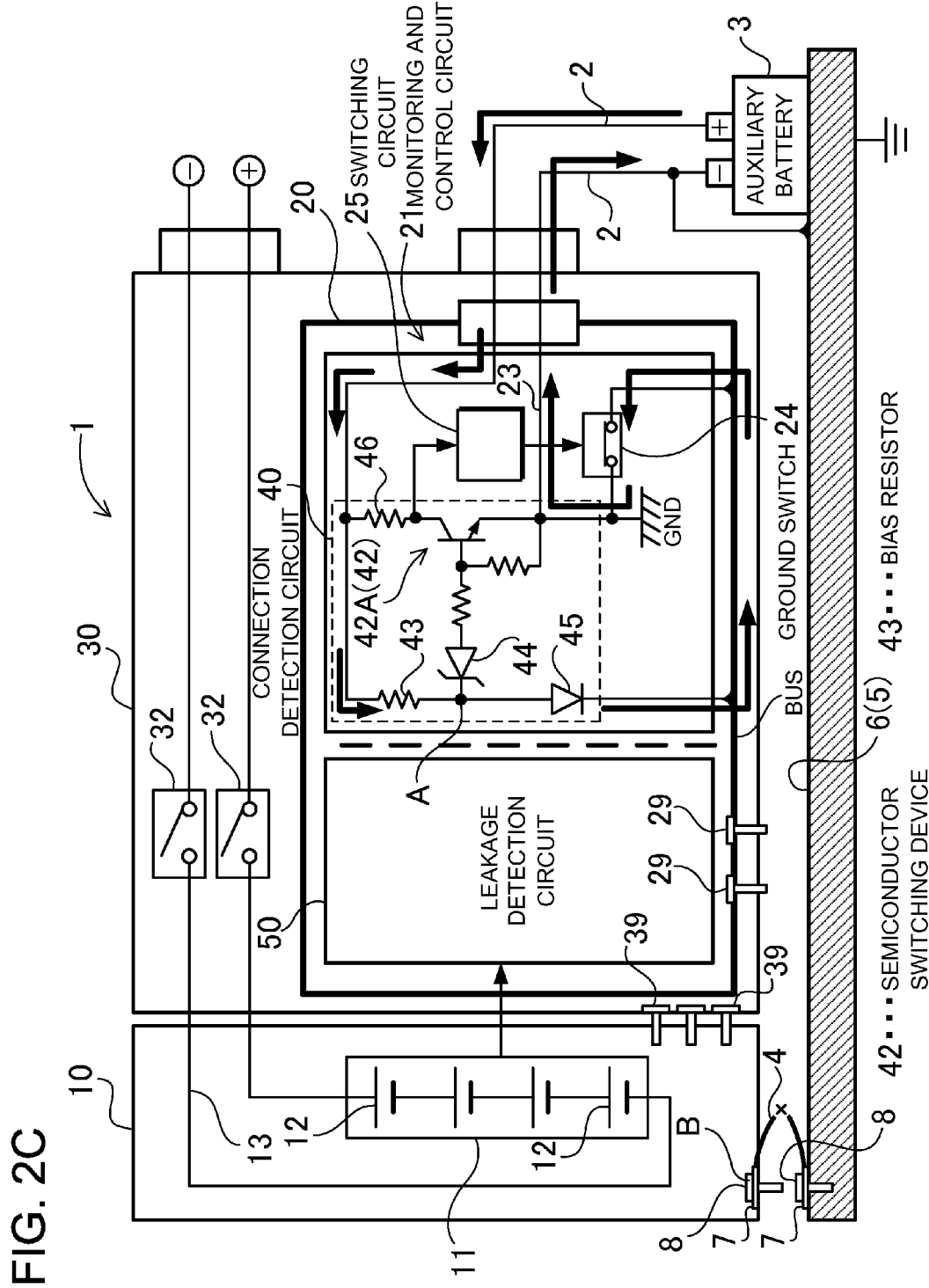

50 LEAKAGE DETECTION CIRCUIT

CAR POWER SOURCE APPARATUS FOR DETECTING A GROUND FAULT IN A VEHICLE POWER SUPPLY

BACKGROUND OF THE INVENTION

1. Field of the Invention

The present invention relates to a car power source apparatus, and in particular to a car power source apparatus with a battery case that is connected to the car chassis ground via a ground line. The battery case houses a driving battery that drives the car, and monitoring and control circuitry for that battery.

2. Description of the Related Art

The car power source apparatus houses a driving battery and monitoring and control circuitry for that battery in a battery case. When the power source apparatus is installed on-board a car, it is necessary for the battery case to be reliably connected to the car chassis ground. This is for detecting driving battery leakage current, and for reducing monitoring and control circuit noise levels. The battery case can be directly attached to the car chassis with fasteners such as bolts to connect the battery case to the car chassis ground. However, since coatings are applied to car chassis surfaces, a stable and reliable electrical connection may not always be achieved in a configuration directly attaching the battery case with bolts. Further, for a battery case made of aluminum to reduce weight and attached to the chassis via bolts at a plurality of locations, metal corrosion can develop as a result of galvanic corrosion. These drawbacks can be resolved by connecting the battery case to the chassis via a ground wire (Refer to Japanese Laid-Open Patent Publication No. 2008-139249).

SUMMARY OF THE INVENTION

In a power source apparatus that connects the battery case to chassis ground via a ground wire, various detrimental effects can result from poor electrical contact of the ground wire. For example, if the connection of the battery case to the chassis ground deteriorates and is not a low impedance connection, monitoring and control circuitry becomes sensitive to the effects of noise. Further, in a power source apparatus provided with circuitry to detect driving battery leakage current, detrimental effects such as inability to detect leakage current result.

The present invention was developed with the object of avoiding these detrimental effects. Thus, it is a primary object of the present invention to provide a car power source apparatus that can detect poor ground line connection with an extremely simple circuit, and by detecting poor ground line connection, can prevent vehicle operation while under the effects of noise.

The car power source apparatus of the present invention is provided with a driving battery 11 that drives the car; a monitoring and control circuit 21 that monitors and controls the driving battery 11, and is connected to the auxiliary battery 3 via power supply lines 2; and a battery case 1 that houses the driving battery 11 and the monitoring and control circuit 21, and is connected to the car chassis ground 5 via a ground line 4. Further, the power source apparatus is provided with a connection detection circuit 40. This connection detection circuit 40 determines the condition of the connection of the battery case 1 and an auxiliary battery 3 power supply line 2 via the ground line 4 and the car chassis ground 5 to determine the condition of the ground line 4 connection.

The power source apparatus described above can detect poor connection of the ground line with an extremely simple circuit. This is because the connection detection circuit determines the condition of the connection of the battery case and power supply lines via the ground line and the chassis ground. Further, by detecting poor ground line connection with the connection detection circuit, operation of the car can be prevented when it is affected by noise, realizing the characteristic that the car can be driven more safely.

The above and further objects of the present invention as well as the features thereof will become more apparent from the following detailed description to be made in conjunction with the accompanying drawings.

BRIEF DESCRIPTION OF THE DRAWINGS

FIG. 2B is an abbreviated organizational view of a car power source apparatus of FIG. 2A in a transitional condition;

FIG. 2C is an abbreviated organizational view of a car power source apparatus of FIG. 2A in an abnormal condition.

DETAILED DESCRIPTION OF THE EMBODIMENT(S)

Figure 1:
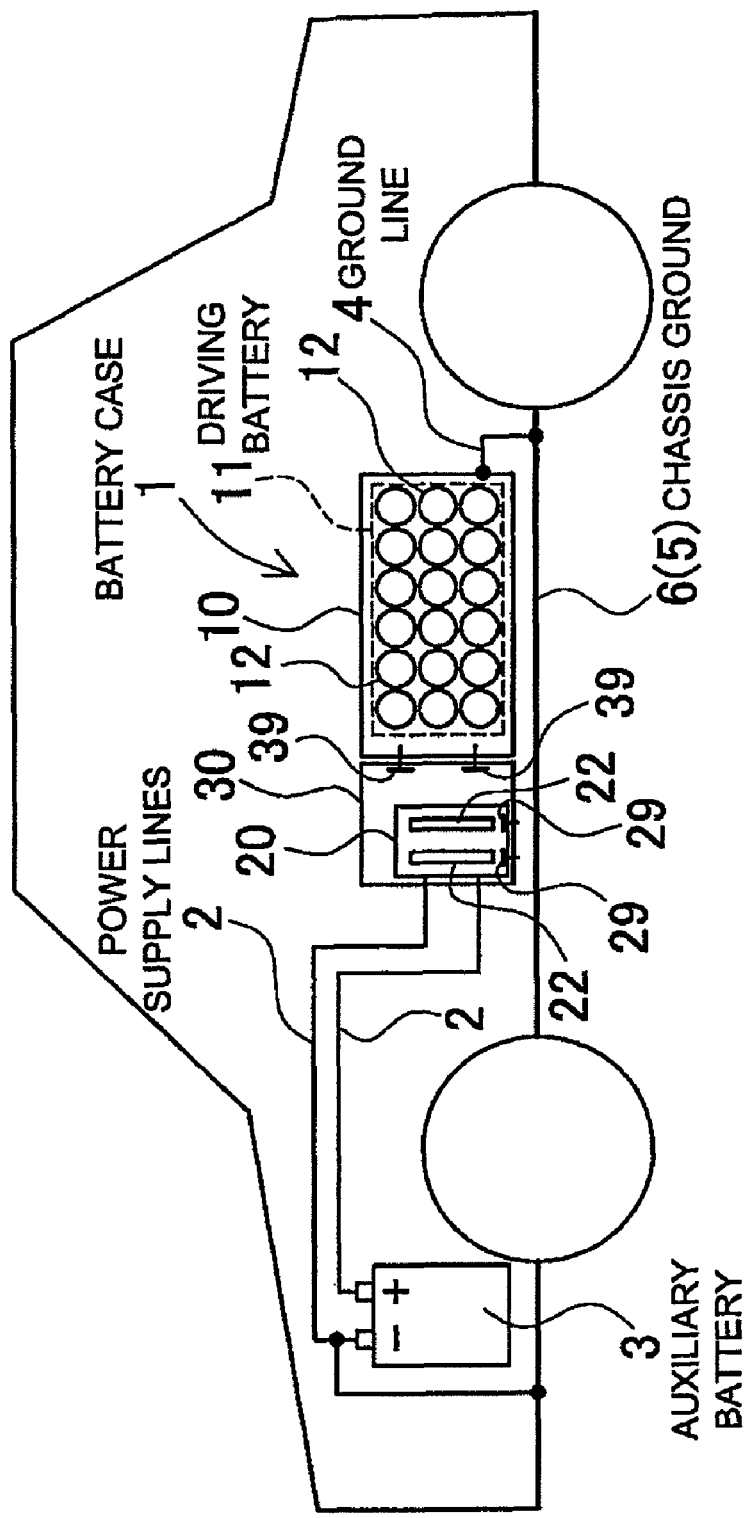
FIG. 1 is a diagrammatic view showing a car power source apparatus for one embodiment of the present invention installed on-board a car.

The car power source apparatus can have a monitoring and control circuit 21 provided with a leakage detection circuit 50. Further, a ground switch 24 can be provided in the battery case 1 to connect the battery case 1 to the negative-side of the power supply lines 2 when the connection detection circuit 40 detects failed ground line 4 connection. In this power source apparatus, if ground line connection failure occurs, the battery case can be connected to the car chassis ground via the ground switch. This insures a high level of safety because driving battery leakage current can be detected by the leakage detection circuit even if the ground line connection fails.

The car power source apparatus can have a connection detection circuit 40 provided with a semiconductor switching device 42 connected between the positive-side and negative-side of the power supply lines 2. The input-side of this semiconductor switching device 42 can be connected to the positive-side power supply line 2 through a bias resistor 43 and to the ground line 4. Bias voltage on the semiconductor switching device 42 changes depending on the condition of the connection of the ground line 4 to the chassis ground 5 allowing the condition of the ground line 4 connection to be determined by the ON or OFF state of the semiconductor switching device 42. This power source apparatus has the characteristic that poor ground line connection can be reliably and stably detected with an extremely low-cost connection detection circuit.

The following describes embodiments based on the figures. The car power source apparatus shown in FIGS. 1 and 2 is provided with a driving battery 11 that drives the car, a monitoring and control circuit 21 that monitors and controls the driving battery 11 and is connected to the auxiliary battery 3 via power supply lines 2, and a battery case 1 that houses the driving battery 11 and the monitoring and control circuit 21.

The battery case 1 is connected to the car chassis ground 5 via a ground line 4. A pliable, low-resistance woven cord having numerous fine wires connected in parallel is used as the ground line 4. One end of this ground line 4 is connected to the battery case 1 and the other end is connected to the chassis ground 5. Both ends of the ground line 4 are attached to connecting rings 7. The connecting rings 7 are attached to the battery case 1 and the car chassis 6 via bolts 8 or set screws.

The battery case 1 of FIGS. 1 and 2 is made up of a battery unit case 10 housing batteries 12, a circuit board case 20 (e.g., electrically conductive housing) housing circuit boards 22 implementing the monitoring and control circuit 21, and an electronic component case 30 housing the circuit board case 20 and other electronic components such as the relays 32. The battery unit case 10 and the electronic component case 30 are made of aluminum to make the overall battery case 1 light-weight. The circuit board case 20 is made of steel to reduce noise levels.

A driving battery 11, which has a plurality of rechargeable batteries 12 connected in series to increase output voltage, is housed in the battery unit case 10. The driving battery 11 ground line 13 is not connected to the battery unit case 10 and is insulated from the battery unit case 10.

Figure 2A:
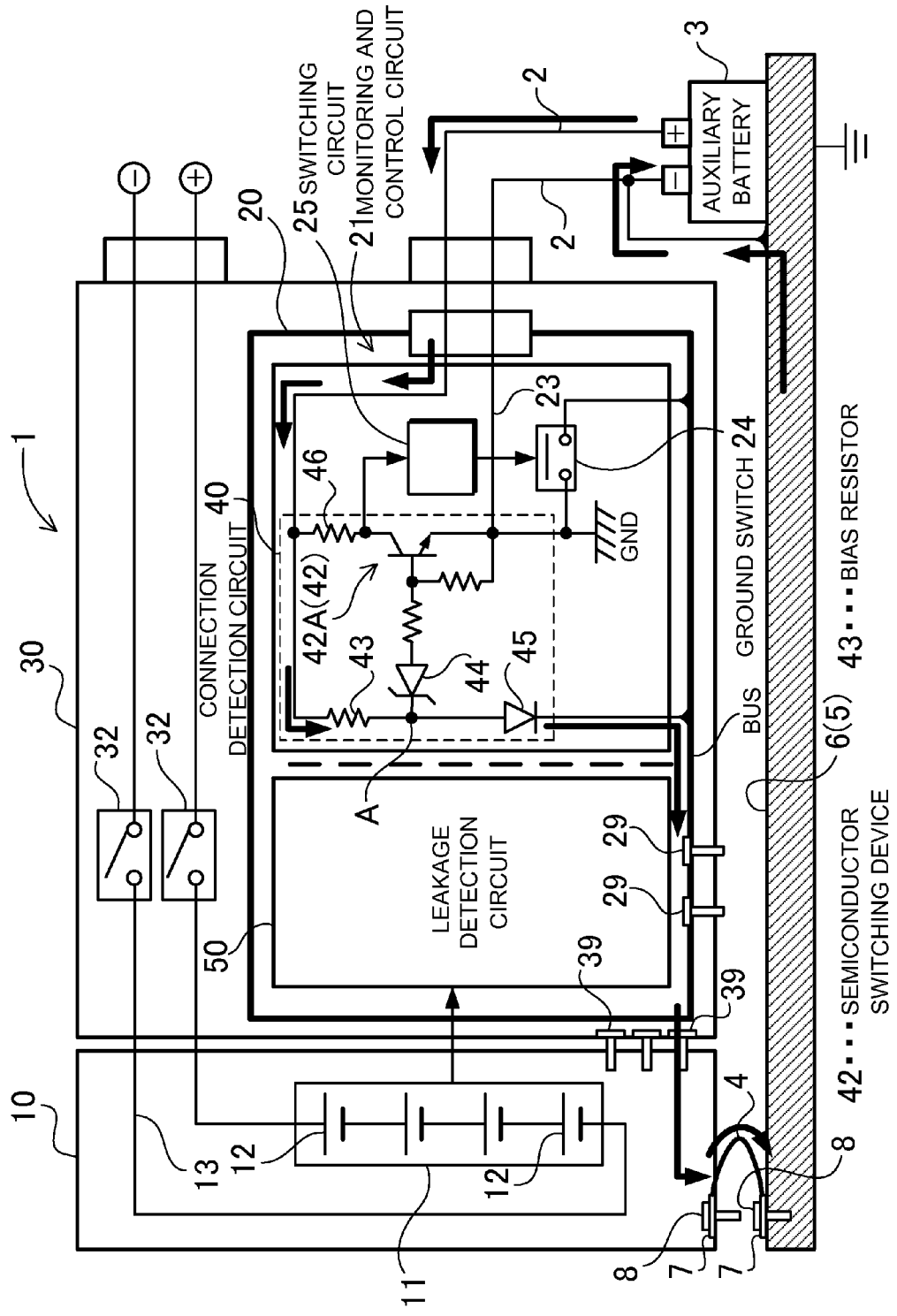
FIG. 2A is an abbreviated organizational view of a car power source apparatus in a normal condition for one embodiment of the present invention

In the battery case 1 of FIG. 2A, the electronic component case 30 is attached to the side of the battery unit case 10, and the circuit board case 20 is housed along with other electronic components such as the relays 32 in the electronic component case 30. Further, the circuit board case 20 is attached to the electronic component case 30 via set screws 29, and the electronic component case 30 is attached to the battery unit case 10 via set screws 39. Set screws 29 electrically connect the circuit board case 20 to the electronic component case 30, and set screws 39 electrically connect the electronic component case 30 to the battery unit case 10. Specifically, the circuit board case 20, the electronic component case 30, and the battery unit case 10 are electrically connected together via set screws 29, 39. In the battery case 1 of the figures, since the battery unit case 10 is connected to chassis ground 5 through the ground line 4, the battery unit case 10, the electronic component case 30, and the circuit board case 20 are all at the same electrical potential connected to chassis ground 5. A battery case 1 made up of a plurality of electrically interconnected cases can be connected to chassis ground 5 by a ground line 4 to any of the cases. Although the battery case 1 of the figures has the battery unit case 10 connected to chassis ground 5, the electronic component case could be connected to chassis ground, or the circuit board case could be connected to chassis ground as well.

The driving battery 11 monitoring and control circuit 21 is mounted on circuit boards 22 housed in the circuit board case 20. The monitoring and control circuit 21 is circuitry including a driving battery 11 charging and discharging control circuit that detects voltage and current for each battery 12 in the driving battery 11, and a leakage detection circuit that detects driving battery 11 leakage current. The monitoring and control circuit 21 is connected to the auxiliary battery 3 via the power supply lines 2. The power supply lines 2 provide power from the auxiliary battery 3 to operate the monitoring and control circuit 21. Consequently, the monitoring and control circuit 21 implements circuitry that operates on power supplied from the auxiliary battery 3. Although all the circuitry of the monitoring and control circuit 21 can be operated on power supplied from the auxiliary battery 3, it can also be operated on power from both the auxiliary battery 3 and the driving battery 11.

The power supply lines 2 connect the auxiliary battery 3 installed on-board the car to the monitoring and control circuit 21. These power supply lines 2 connect the positive-side and negative-side of the auxiliary battery 3 to the monitoring and control circuit 2. The ground line 23 of the monitoring and control circuit 21 is connected to the negative-side of the auxiliary battery 3 by a power supply line 2. The negative-side of the auxiliary battery 3 is connected to the car chassis ground 5. Therefore, the ground line 23 of the monitoring and control circuit 21 is connected to the car chassis ground 5 by a power supply line 21. However, the ground line 23 of the monitoring and control circuit 21 is not connected to the battery case 1 and is routed in a manner insulated from the battery case 1.

On the other hand, in the power source apparatus of FIG. 2A, the monitoring and control circuit 21 ground line 23 can be connected to the battery case 1 through the ground switch 24. Since this ground switch 24 is normally kept in the OFF state, the monitoring and control circuit 21 ground line 23 is not connected to the battery case 1 under normal operating conditions. The ground switch 24 is turned ON only when the ground line 4 fails to make connection as shown in FIG. 2C. Since the monitoring and control circuit 21 ground line 23 is connected to the battery case 1 when the ground switch 24 is turned ON, the battery case 1 is connected to car chassis ground 5 through the monitoring and control circuit 21 ground line 23 and the negative-side power supply line 2. In a power source apparatus as described above that turns the ground switch 24ON for a failed ground line 4 connection to connect the battery case 1 to the car chassis ground 5, driving battery 11 leakage can be detected even when the ground line 4 connection fails as shown in FIG. 2C.

If the ground line 4 connection fails, the monitoring and control circuit 21 becomes easily influenced by noise, and desired driving conditions cannot be attained. However, even under these conditions, the battery case 1 can be connected to chassis ground 5 to allow detection of dangerous leakage current and improve safety. The leakage detection circuit 50 measures leakage current between the driving battery 11 and chassis ground 5 to detect leakage. If the battery case 1 becomes disconnected from chassis ground 5, driving battery 11 leakage cannot be detected. This is because even if the driving battery 11 develops leakage current to the battery case 1, this leakage current does not flow to chassis ground 5. By connecting the battery case 1 and chassis ground 5, leakage current to the battery case 1 becomes leakage current to chassis ground 5 and that leakage can be detected. In this power source apparatus, if the ground line 4 connection fails, the ground switch 24 is turned ON to connect the battery case 1 to the chassis ground 5 as shown in FIG. 2C. This power source apparatus achieves the characteristic that driving battery 11 leakage can be detected not only when the ground line 4 is properly connected, but also when ground line 4 connection fails.

Figure 3:
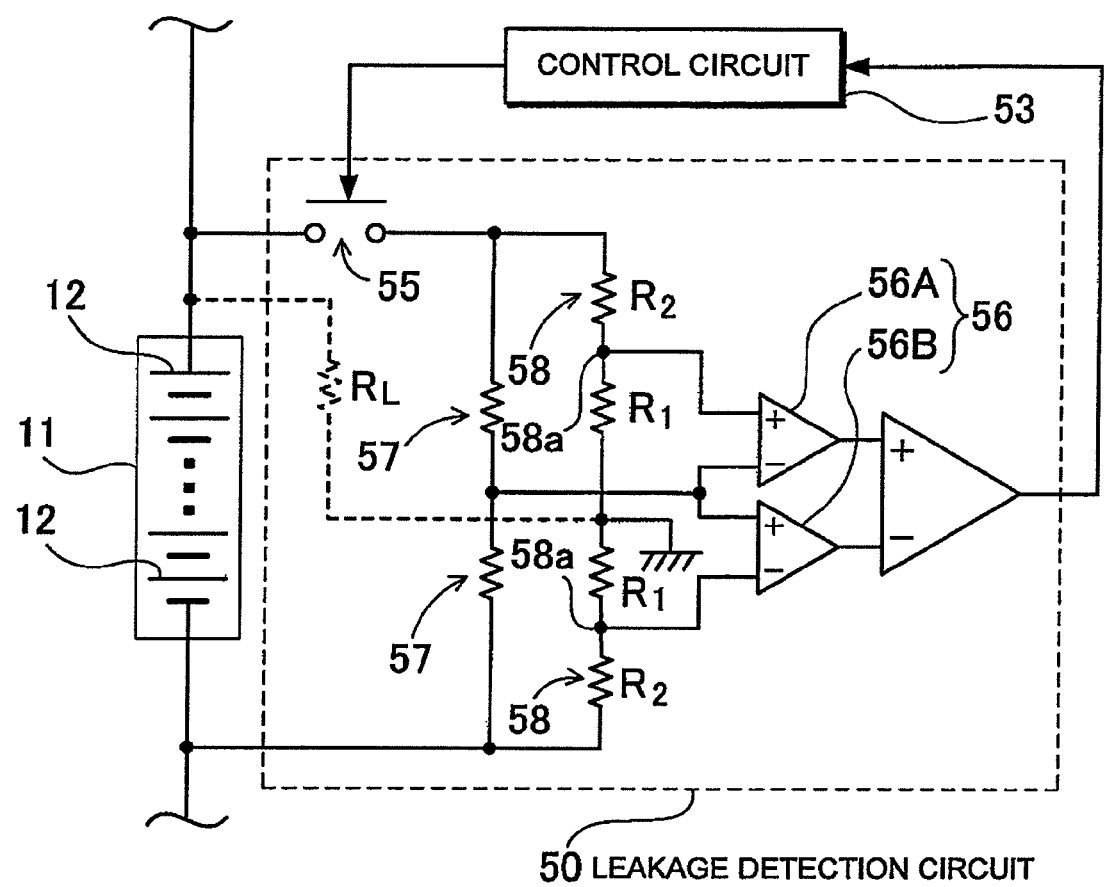
FIG. 3 is a block diagram showing one example of a leakage detection circuit.

Driving battery 11 leakage detection can be implemented, for example, by the leakage detection circuit 50 shown in FIG. 3. The leakage detection circuit 50 of the figure is provided with an input switch 55 and a pair of difference amplifiers 56. The input switch 55 is controlled ON and OFF by the control circuit 53. The input switch 55 is turned ON only for driving battery 11 leakage detection. The two difference amplifiers 56 have one input terminal connected to the center-point of two series connected resistors 57. In the leakage detection circuit 50 of the figure, the inverting (−) input of the upper difference amplifier 56A and the non-inverting (+) input of the lower difference amplifier 56B are connected to the center-point of two series connected resistors 57. The series connected resistors 57 are two resistors of the same value connected in series. Both ends of the series connected resistors 57 are connected to the driving battery 11 putting them in parallel with the driving battery 11.

The other input terminals of the difference amplifiers 56 are connected to divider-nodes 58a of voltage divider resistors 58. The voltage divider resistors 58 are a pair of two voltage dividers connected in series with equal total resistance. Each voltage divider has two resistors 58 connected in series with the same resistor value ratio. Both the upper and lower voltage dividers of the figure have a ground-side resistor R1 connected to ground, a power-side resistor R2 connected to the driving battery 11, and an equal ratio R1/R2 for the two voltage dividers. Consequently, when the driving battery 11 has no leakage current, the voltage across each ground-side resistor R1 is equal, and those equal voltages are input to the upper and lower difference amplifiers 56. The pair of voltage dividers is connected in series and that series connected pair of voltage dividers is connected in parallel with the driving battery 11. The common connection point of the series connected pair of voltage dividers is connected to ground, and both ends of the series connected voltage divider resistors 58, namely the power-sides of the resistors 58, are connected to the positive and negative output terminals of the driving battery 11. The divider-node 58a at the connection of the ground-side resistor R1 and the power-side resistor R2 of each voltage divider is connected to one input terminal of each difference amplifier 56. In the figure, the divider-node 58a of the upper voltage divider resistors 58 is connected to the non-inverting (+) input terminal of the upper difference amplifier 56A, and the divider-node 58a of the lower voltage divider resistors 58 is connected to the inverting (−) input terminal of the lower difference amplifier 56B.

The total resistance of the voltage divider resistors 58 and the series connected resistors 57 is a high resistance value such as 1MΩ-10MΩ. The risk of electric shock can be reduced in a leakage detection circuit 50 with voltage divider resistors 58 and series connected resistors 57 of this order of magnitude.

The leakage detection circuit 50 detects driving battery 11 leakage by the following operation. For the following description, each series connected resistor 57 is 2MΩ, ground-side resistors R1 are 1MΩ, power-side resistors R2 are 9MΩ, driving battery 11 output voltage is 200V, and the negative-side output terminal of the driving battery 11 is 0V. When the driving battery 11 has no leakage, the voltages at critical nodes are as follows.

(1) Voltage at the Center-Point of the Series Connected Resistors 57

Here, the two series connected resistors 57 divide the 200V driving battery 11 output voltage to produce 100V.

(2) Voltage at the Center-Point of the Voltage Divider Resistors 58

Again, the resistors 58 of the two voltage dividers divide the 200V driving battery 11 output voltage to produce 100V.

(3) Voltage Across the Ground-Side Resistors R1

The voltage across each voltage divider is 100V. This voltage is divided in accordance with the ratio of the ground-side resistor R1 to the power-side resistor R2. Since the ratio of the ground-side resistor R1 to the power-side resistor R2 is 1:9, 100V across the voltage divider is divided into 10V and 90V. Therefore, the voltage across the ground-side resistors R1 is 10V.

Since 10V is input to both difference amplifiers 56, the output voltage of each difference amplifier 56 is equal. When the output voltage of both difference amplifiers 56 is equal, the leakage detection circuit 50 determines that there is no driving battery 11 leakage.

If there is leakage from the driving battery 11, either the positive-side or the negative-side of the driving battery 11 will be connected to ground via a leakage resistance $R_L$. Here, suppose there is leakage from the positive-side of the driving battery 11 to connect a leakage resistance $R_L$ between the positive-side of the driving battery 11 and ground. The leakage resistance $R_L$ is connected in parallel with the positive-side voltage divider resistors 58 and reduces the effective resistance of those positive-side voltage divider resistors 58. Under these conditions, the voltage across the positive-side voltage divider resistors 58 becomes lower than the voltage across the negative-side voltage divider resistors 58. This is because the two resistors 58 of each voltage divider combine to act as single resistors that divide driving battery 11 output voltage at the center-point. Therefore, input voltage of the upper difference amplifier 56A of the figure becomes lower than that of the lower difference amplifier 56B, and output voltage of the upper difference amplifier 56A becomes lower than that of the lower difference amplifier 56B. Consequently, a difference develops between the output voltages of the two difference amplifiers 56. The leakage detection circuit 50 determines there is driving battery 11 leakage when the output voltages of the two difference amplifiers 56 are not the same.

However, the leakage detection circuit 50 of the present invention is not limited to the circuit shown in FIG. 3. Although not illustrated, the leakage detection circuit can also detect driving battery 11 leakage with one difference amplifier. In this leakage detection circuit one input terminal (inverting input) of the difference amplifier is connected to the center-point of the series connected resistors and the other input terminal (non-inverting input) is connected to ground. This allows driving battery leakage to be detected by difference amplifier output voltage. This is because output voltage of the difference amplifier changes depending on whether or not there is leakage from the driving battery. When there is no driving battery leakage, difference amplifier output voltage is 0V. When there is leakage from the negative-side of the driving battery, a positive voltage is output from the difference amplifier. When there is leakage from the positive-side of the driving battery, a negative voltage is output from the difference amplifier.

Further, the power source apparatus is provided with a connection detection circuit 40 to determine the condition of the ground line 4 connection. The connection detection circuit 40 determines the condition of the connection of the auxiliary battery 3 power supply lines 2 through the ground line 4 and the car chassis ground 5 to detect failure of the ground line 4 connection. The connection detection circuit 40 of FIG. 2A, is provided with a semiconductor switching device 42 connected between the positive-side and negative-side of the power supply lines 2. The semiconductor switching device 42 of the figure is a bipolar transistor 42A. However, a field effect transistor (FET) can also be used instead of the bipolar transistor as the semiconductor switching device. The input-side of the semiconductor switching device 42, which is the base of the bipolar transistor, is connected to the positive-side power supply line 2 through a bias resistor 43, and to ground. If the ground line 4 connection fails and the base becomes disconnected from the chassis ground 5 via the ground line 4 as shown in FIG. 2B, the bias resistor 43 has an electrical resistance that will switch the semiconductor switching device 42 ON. Further, in the connection detection circuit 40 of the figure, the semiconductor switching device 42 transistor 42A base is connected to the bias resistor 43 through a diode 44, and the bias resistor 43 is also connected to the battery case 1 through a diode 45. Diodes 44, 45 prevent damage to the transistor 42A in the case where ground line 4 connection fails and the potential of the battery case 1 becomes a high voltage.

In the connection detection circuit 40 described above, semiconductor switching device 42 bias voltage changes depending on whether or not the ground line 4 is connected to chassis ground 5, and the semiconductor switching device 42 is switched ON or OFF depending on the bias voltage. Specifically, when the ground line 4 makes a good connection, the ground line 4 connects the transistor 42A base to the negative-side of the auxiliary battery 3 via the battery case 1 and the chassis ground 5. Under these conditions, no bias voltage is input to the base to turn the transistor 42A ON, and the transistor 42A is in the OFF state. However, if the ground line 4 connection fails, the transistor 42A base becomes disconnected from the chassis ground 5. Consequently, the transistor 42A base becomes disconnected from the negative-side of the auxiliary battery 3. Under these conditions, bias current flows from the positive-side of the auxiliary battery 3, through the bias resistor 43, and into the base of the transistor 42A to switch the transistor 42A ON. Therefore, in the connection detection circuit 40 of the figure, the transistor 42A is OFF when the ground line 4 connects the battery case 1 to the chassis ground 5, and the transistor 42A is switched ON when the ground line 4 connection fails. A load resistor 46 is connected at the collector of the transistor 42A to detect the ON and OFF states of the transistor 42A. In the OFF state, no current flows through the load resistor 46, there is no voltage drop from the power supply voltage across the load resistor 46, and a HIGH voltage level is output from the collector of the transistor 42A. When the transistor 42A is turned ON, the transistor 42A connects the load resistor 46 to the ground line 23, and a LOW voltage level is output from the collector of the transistor 42A. Therefore, when the ground line 4 is properly connected, the transistor 42A outputs a HIGH level, when the ground line 4 connection fails, the transistor 42A outputs a LOW level, and the condition of the ground line 4 connection can be judged from a HIGH or LOW output.

The previously mentioned ground switch 24 is a relay or a semiconductor switching device. This ground switch 24 is controlled ON and OFF by a switching circuit 25. The switching circuit 25 switches the ground switch 24 OFF or ON depending on a HIGH or LOW output from the connection detection circuit 40. Specifically, when a HIGH output is detected from the connection detection circuit 40, the ground switch 24 is OFF as shown in FIG. 2A. When a LOW output is detected from the connection detection circuit 40, the ground switch 24 is turned ON as shown in FIG. 2C. Therefore, when the ground line 4 is properly connected, the switching circuit 25 controls the ground switch 24 to the OFF state. If the ground line 4 connection fails, the switching circuit 25 switches the ground switch 24ON to connect the ground line 23 of the monitoring and control circuit 21 to the battery case 1. With the ground switch 24 in the ON state, the battery case 1 is connected to the ground line 23 of the monitoring and control circuit 21 and to the car chassis ground 5 through the negative-side power supply line 2.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims. The present application is based on Application No. 2008-222, 489 filed in Japan on Aug. 29, 2008, the content of which is incorporated herein by reference.

What is claimed is:

1. A car power source apparatus comprising:
   a driving battery that outputs an output voltage to drive a car;
   a monitoring and control circuit that monitors and controls the driving battery and is connected, via a ground line connection, to an auxiliary battery via power supply lines;
   a battery case that houses the driving battery and the monitoring and control circuit and is connected to a car chassis ground via a ground line; and
   a connection detection circuit that determines a condition of the ground line connection between the battery case and the car chassis ground, so as to determine whether or not the ground line connection has failed;
   wherein the connection detection circuit determines the condition of the ground line connection between the battery case and the car chassis ground by detecting a condition of a connection between the battery case and one of the power supply lines connected to the auxiliary battery via the ground line and the car chassis ground.

2. The car power source apparatus as recited in claim 1, wherein the monitoring and control circuit includes a leakage detection circuit, and
   wherein a ground switch is included inside the battery case to connect the battery case with a negative-side power supply line connected to the auxiliary battery when the connection detection circuit detects that the ground line connection between the battery case and the car chassis ground has failed.

3. The car power source apparatus as recited in claim 2, wherein the leakage detection circuit detects leakage current between the driving battery and the car chassis ground to detect leakage.

4. The car power source apparatus as recited in claim 1,
   wherein the connection detection circuit includes a semiconductor switching device connected between a positive-side power supply line of the power supply lines and a negative-side power supply line of the power supply line,
   wherein an input-side of the semiconductor switching device is connected through a bias resistor to the positive-side power supply line and to the ground line,
   wherein a bias voltage of the semiconductor switching device changes depending on whether or not the ground line is connected to the car chassis ground, and
   wherein the semiconductor switching device is switched OFF or ON to determine the condition of the ground line connection between the battery case and the car chassis ground.

5. The car power source apparatus as recited in claim 4, wherein the input-side of the semiconductor switching device of the connection detection circuit is connected to the bias resistor through a diode.

6. The car power source apparatus as recited in claim 4, wherein the bias resistor is connected to the ground line through a diode.

7. The car power source apparatus as recited in claim 4, wherein the semiconductor switching device is turned OFF when the ground line connects the battery case to the car chassis ground, and is switched ON when the ground line connection between the battery case and the car chassis ground fails.

8. The car power source apparatus as recited in claim 7, wherein the semiconductor switching device is a bipolar transistor, wherein a load resistor is connected to a collector of the bipolar transistor, wherein an output of the bipolar transistor is HIGH for a normal ground line connection between the battery case and the car chassis ground and LOW for a ground line connection failure between the battery case and the car chassis ground, and wherein the condition of the ground line connection between the battery case and the car chassis ground is judged by a HIGH or a LOW output from the bipolar transistor.

9. The car power source apparatus as recited in claim 8, wherein the connection detection circuit includes a ground switch to connect the battery case with the negative-side power supply line, when the ground line connection between the battery case and the car chassis ground fails, wherein the ground switch is switched OFF for a HIGH output from the bipolar transistor and is switched ON for a LOW output from the bipolar transistor, and wherein the ground switch is switched ON for a ground line connection failure to connect the battery case to the car chassis ground.

10. The car power source apparatus as recited in claim 1, wherein the battery case includes a battery unit case housing the driving battery, a circuit board case housing circuit boards implementing the monitoring and control circuit, and an electronic component case housing the circuit board case, wherein the circuit board case is attached to the electronic component case via first set screws, wherein the electronic component case is attached to the battery unit case via second set screws, wherein the first set screws electrically connect the circuit board case to the electronic component case, and wherein the second set screws electrically connect the electronic component case to the battery unit case.

11. The car power source apparatus as recited in claim 10, wherein the ground line is connected to either the battery unit case, the circuit board case, or the electronic component case, so as to connect the battery case to the car chassis ground.

12. The car power source apparatus as recited in claim 1, wherein the monitoring and control circuit is circuitry that detects a voltage and a current of each individual battery that makes up the driving battery and controls charging and discharging of the driving battery.

13. The car power source apparatus as recited in claim 1, wherein the monitoring and control circuit is a leakage detection circuit that detects leakage of the driving battery.

14. The car power source apparatus as recited in claim 1, wherein the monitoring and control circuit is connected to the auxiliary battery via the power supply lines, and operating power is supplied from the auxiliary battery to the monitoring and control circuit by the power supply lines.

\* \* \* \* \*